United States Patent
Wilcox et al.

(10) Patent No.: US 9,787,022 B2
(45) Date of Patent: Oct. 10, 2017

(54) METHODS AND SYSTEMS FOR MAGNETIC COUPLING

(71) Applicant: JoyLabz LLC, Santa Cruz, CA (US)

(72) Inventors: Bryan Randall Wilcox, Mahomet, IL (US); Todd Eddie, Merritt Island, FL (US); Jay Saul Silver, Airmont, NY (US)

(73) Assignee: JOYLABZ LLC, Santa Cruz, CA (US)

( * ) Notice: Subject to any disclaimer, the term of this patent is extended or adjusted under 35 U.S.C. 154(b) by 0 days.

(21) Appl. No.: 15/146,652

(22) Filed: May 4, 2016

(65) Prior Publication Data

US 2016/0329658 A1 Nov. 10, 2016

Related U.S. Application Data

(60) Provisional application No. 62/159,185, filed on May 8, 2015.

(51) Int. Cl.
*H01R 11/30* (2006.01)
*H01R 13/62* (2006.01)
(Continued)

(52) U.S. Cl.
CPC .......... *H01R 13/6205* (2013.01); *G06F 1/16* (2013.01); *H01R 13/6658* (2013.01); *H05K 1/11* (2013.01); *H05K 5/0278* (2013.01); *H01R 11/24* (2013.01); *H01R 2201/06* (2013.01); *H05K 1/111* (2013.01); *H05K 1/113* (2013.01); *H05K 1/117* (2013.01); *H05K 2201/083* (2013.01);
(Continued)

(58) Field of Classification Search
CPC ................................. H01R 13/6205

USPC ........................................ 439/39, 76.1, 482
See application file for complete search history.

(56) References Cited

U.S. PATENT DOCUMENTS 3,808,532 A * 4/1974 Yuska ................ G01R 1/04
                                         324/754.07
4,084,869 A * 4/1978 Yen ..................... H05K 1/18
                                         439/651

(Continued)

FOREIGN PATENT DOCUMENTS

WO    2013-106284    7/2013

OTHER PUBLICATIONS

Extended European Search Report for Application No. 16167926.1 dated Nov. 16, 2016 (6 pages).
(Continued)

*Primary Examiner* — Neil Abrams
(74) *Attorney, Agent, or Firm* — Michael Best & Friedrich LLP

(57) ABSTRACT

Systems and methods for magnetic coupling. One system includes an external computing device and a connector having a conductive end. The system also includes a printed circuit board. The printed circuit board includes a connector side opposite a back side. The connector side has a contact pad with an aperture. The printed circuit board also includes a magnet positioned on the back side of the printed circuit board. The magnet provides a magnetic field configured to provide magnetic attraction forces to a connector contacting the contact pad. The printed circuit board also includes a communication terminal. The system also includes a circuit in communication with the printed circuit board through the connector and contact pad.

20 Claims, 8 Drawing Sheets

(51) Int. Cl.
*G06F 1/16* (2006.01)
*H05K 1/11* (2006.01)
*H05K 5/02* (2006.01)
*H01R 13/66* (2006.01)
*H01R 11/24* (2006.01)

(52) U.S. Cl.
CPC .............. *H05K 2201/094* (2013.01); *H05K 2201/0939* (2013.01); *H05K 2201/09381* (2013.01); *H05K 2201/09427* (2013.01); *H05K 2201/09481* (2013.01); *H05K 2201/10386* (2013.01)

(56) References Cited

U.S. PATENT DOCUMENTS

| | | | | |
|---|---|---|---|---|
| 4,214,132 A * | 7/1980 | Kelso | ............... | H04M 1/24 324/756.01 |
| 4,620,765 A * | 11/1986 | Knickerbocker | .... | G01R 1/0408 439/344 |
| 4,947,846 A * | 8/1990 | Kitagawa | ............ | A61B 5/0416 600/391 |
| 5,332,397 A * | 7/1994 | Ingalsbe | ............... | H01R 31/06 439/456 |
| 5,341,812 A * | 8/1994 | Allaire | ............... | A61B 5/04286 600/508 |
| 5,743,750 A * | 4/1998 | Sullivan | ............ | H01R 31/005 379/21 |
| 5,781,759 A * | 7/1998 | Kashiwabara | ......... | H01R 12/62 324/756.02 |
| 6,424,522 B1 | 7/2002 | Lin et al. | | |
| 6,449,167 B1 * | 9/2002 | Seymour | ............ | G01R 1/0408 335/205 |
| 7,322,857 B2 * | 1/2008 | Chen | ................ | H01R 12/7041 439/623 |
| 7,344,380 B2 * | 3/2008 | Neidlein | ............ | H01R 13/6205 439/374 |
| 7,611,357 B2 * | 11/2009 | Han | ...................... | H01R 11/30 434/224 |
| 7,637,747 B2 * | 12/2009 | Jaatinen | ............... | A61B 5/0408 439/39 |
| 7,714,569 B2 * | 5/2010 | Li | ......................... | H01R 31/06 324/756.05 |
| 8,187,006 B2 * | 5/2012 | Rudisill | ................ | H01R 11/30 362/249.06 |
| 9,261,535 B2 * | 2/2016 | Jakobson | ........... | G01R 1/06738 |
| 9,325,107 B2 * | 4/2016 | Karls | ................. | H01R 13/6205 |
| 2008/0068816 A1 | 3/2008 | Han et al. | | |
| 2008/0107867 A1 | 5/2008 | Miekka | | |
| 2008/0132090 A1 | 6/2008 | Bozzone et al. | | |
| 2009/0111320 A1 | 4/2009 | Johansson et al. | | |
| 2013/0175979 A1 | 7/2013 | Chang | | |
| 2015/0093920 A1 | 4/2015 | Colantuono et al. | | |
| 2015/0111399 A1 | 4/2015 | Karls et al. | | |
| 2016/0070362 A1 | 3/2016 | Silver et al. | | |
| 2016/0329658 A1* | 11/2016 | Wilcox | ............. | H01R 13/6205 |

OTHER PUBLICATIONS

International Search Report and Written Opinion for Application No. PCT/US2016/030799 dated Jul. 27, 2016 (11 pages).
"MaKey MaKey: An Invention Kit for Everyone", <https://web.archive.org/web/20130408084417/http://makeymakey.com/>, Available at least as early as Apr. 8, 2013 (7 pages).

* cited by examiner

METHODS AND SYSTEMS FOR MAGNETIC COUPLING

RELATED APPLICATIONS

This application claims priority to U.S. Provisional Application No. 62/159,185, filed May 8, 2015, the entire content of which is herein incorporated by reference.

FIELD OF THE INVENTION

The present invention relates to methods and systems for coupling a conductive connector to a printed circuit board.

BACKGROUND

Printed circuit boards may be coupled, either permanently or semi-permanently, to external devices or circuits. Semi-permanent coupling can be achieved through a selectively releasable mechanical coupling (e.g., attaching an alligator clip). However, such mechanical coupling may involve precise aiming and alignment. Furthermore, in some situations the mechanical coupling can accidently become mechanically disengaged.

SUMMARY

Accordingly, there is a need for improved systems and methods of coupling. In particular, a coupling configuration that enables the user to quickly make an electrical connection without precise aiming or aligning is desirable. Furthermore, a coupling configuration that maintains an electrical connection in situations where the mechanical coupling accidentally becomes mechanically disengaged is also desirable.

Accordingly, embodiments of the invention relate to methods and systems for magnetic coupling, such as magnetically coupling a conductive connector with a printed circuit board (e.g., a circuit board) to provide an electrical connection. For example, one embodiment of the invention provides a system for magnetically coupling a plurality of electronic components. The system includes an external computing device and a connector having a conductive end. The system also includes a printed circuit board. The printed circuit board includes a connector side opposite a back side. The connector side having a contact pad with an aperture. The printed circuit board also includes a magnet positioned on the back side of the printed circuit board. The magnet providing a magnetic field configured to provide magnetic attraction forces to a connector contacting the contact pad. The printed circuit board also includes a communication terminal. The system also includes a circuit in communication with the printed circuit board through the connector and contact pad.

Another embodiment of the invention provides a peripheral device. The peripheral device includes a connector side opposite a back side. The connector side having a contact pad with an aperture. The peripheral device also includes a magnet positioned on the back side of the peripheral device. The magnet providing a magnetic field configured to provide magnetic attraction forces to a connector contacting the contact pad. The peripheral device also includes a communication terminal.

Yet another embodiment the invention provides a method of magnetic coupling. The method includes receiving, by a communication terminal of a printed circuit board, computer terminals of an external computing device. The method also includes receiving, by a contact pad on a connector side of the printed circuit board, a connector coupled to a circuit. The method also includes providing magnetic attraction forces, by a magnet positioned on a back side of the printed circuit board opposite the connector side, to attract the connector to the contact pad. The method also includes receiving, by a logic circuit of the printed circuit board, a first signal from the circuit via the contact pad. The method also includes outputting a second signal to the external computing device via the communication terminal in response to the first signal.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It should also be noted that a plurality of hardware and software based devices, as well as a plurality of different structural components may be used to implement the invention. In addition, it should be understood that embodiments of the invention may include hardware, software, and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the invention may be implemented in software (e.g., stored on non-transitory computer-readable medium) executable by one or more processors. As such, it should be noted that a plurality of hardware and software based devices, as well as a plurality of different structural components may be utilized to implement the invention.

Figure 1:
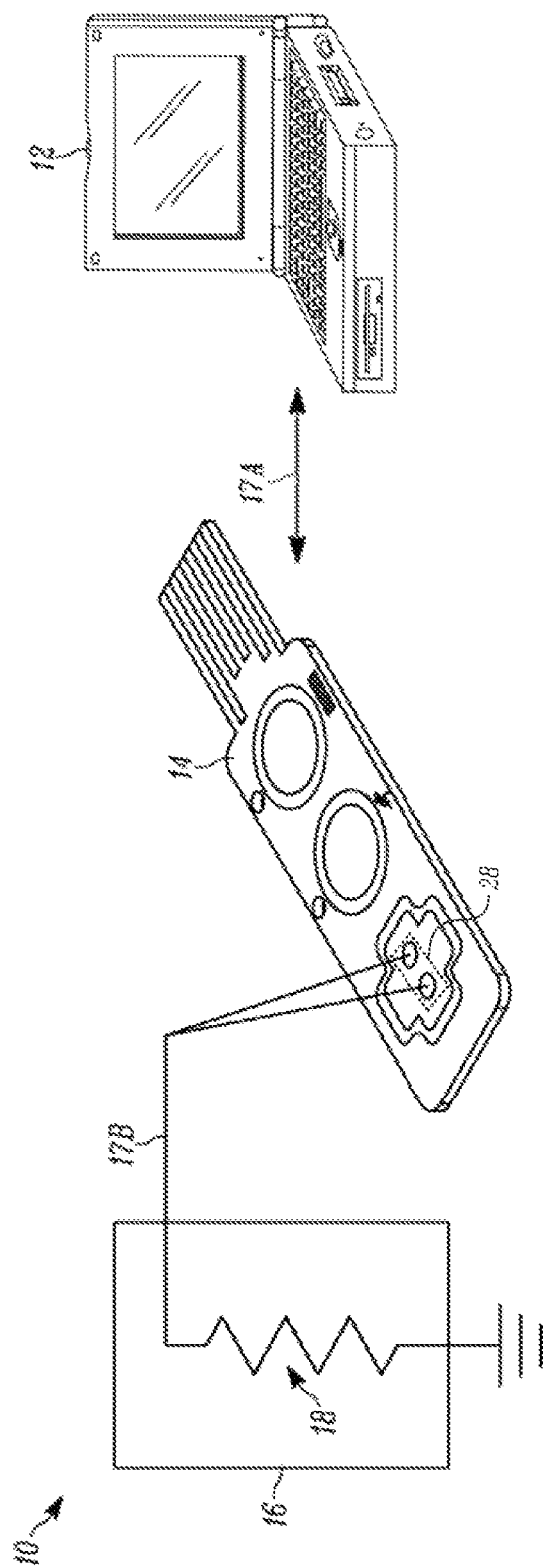
FIG. 1 illustrates a schematic diagram of a system for magnetic coupling that includes an external computing device, a printed circuit board, and a circuit.

FIG. 1 illustrates a system 10 for magnetic coupling in accordance with some embodiments. The system 10 includes an external computing device 12, a printed circuit board 14, and a circuit 16. The external computing device 12 may include, for example, a desktop computer, a laptop computer, a tablet computer, a communication device, such as a smart telephone or smart wearable, and the like. The external computing device 12 can be in communication with (e.g., transmits data to or receives data from) the printed circuit board 14 through a wired or wireless connection 17a. In some embodiments, the external computing device 12 communicates with the printed circuit board 14 over a wired connection (e.g., via a universal serial bus (USB®) cable, Firewire®, Thunderbolt® port, and the like). The external computing device 12 can provide power (e.g., 5 volts direct current (DC)) to the printed circuit board 14 via the wired connection, which powers components (e.g., a microcontroller, an integrated circuit, and the like) of the printed circuit board 14. In other embodiments, in place of or in addition to the wired connection, a wireless connection, such as Bluetooth® or Wi-Fi®, is used for communications between the printed circuit board 14 and the external computing device 12. In wireless implementations or implementations where a wired connection does not provide power, a portable power supply (e.g., a battery) may be coupled to the printed circuit board 14 to provide power.

The printed circuit board 14 (e.g., a circuit board) mechanically supports and electrically connects electronic components (e.g., microcontroller, memory, integrated circuits, resistors, capacitors, inductors, and the like) using conductive tracks, pads, and other features etched from conductive sheets (e.g., copper sheets) laminated onto a non-conductive substrate (e.g., an electrical insulator). In some embodiments, the electronic components on the printed circuit board 14 can be bonded to the conductive tracks with conductive materials, such as solder. In other embodiments, the electronic components on the printed circuit board 14 can be coupled (e.g., via electrical connectors and cables) to the printed circuit board 14.

The printed circuit board 14 can also include connectors to couple the printed circuit board 14 to other devices. The connectors can provide a semi-permanent connection to the printed circuit board 14. In some embodiments, the connectors can be held in place by friction (e.g., tight tolerances between mating features), latching mechanisms, threaded features (e.g., F connector, BNC (Bayonet Neill-Concelman) connector, or RS-232 connector), and/or resilient members (e.g., springs).

In accordance with some embodiments, the printed circuit board 14 can be a programmable device. For example, in some embodiments, the printed circuit board 14 is a computer peripheral device that simulates, for example, a keyboard or mouse, based on user inputs.

As illustrated in FIG. 1, the printed circuit board 14 can communicate with the circuit 16 via a connection 17b. The connection 17b is a wired connection. In some embodiments, the circuit 16 is a conductive circuit loop including a conductive element 19 (illustrated as a resistor) coupled to ground. Although FIG. 1 illustrates the conductive element 18, any material that can conduct electricity, even if only slightly, may be implemented. For example, the conductive element 18 can include an apple, ketchup, pencil graphite, finger paint, lemons, plants, coins, other humans, silverware, water (and wet objects), most foods, cats, dogs, aluminum roil, rain, and the like. The printed circuit board 14 may be configured to detect the selective presence and absence of the conductive element 18 which completes or opens a circuit loop. For example, the conductive element 18 (e.g., an apple) may be selectively inserted into the circuit 16 and selectively remove from the circuit 16 by selectively grounding the apple and disconnecting the apple from ground, respectively.

Figure 2:
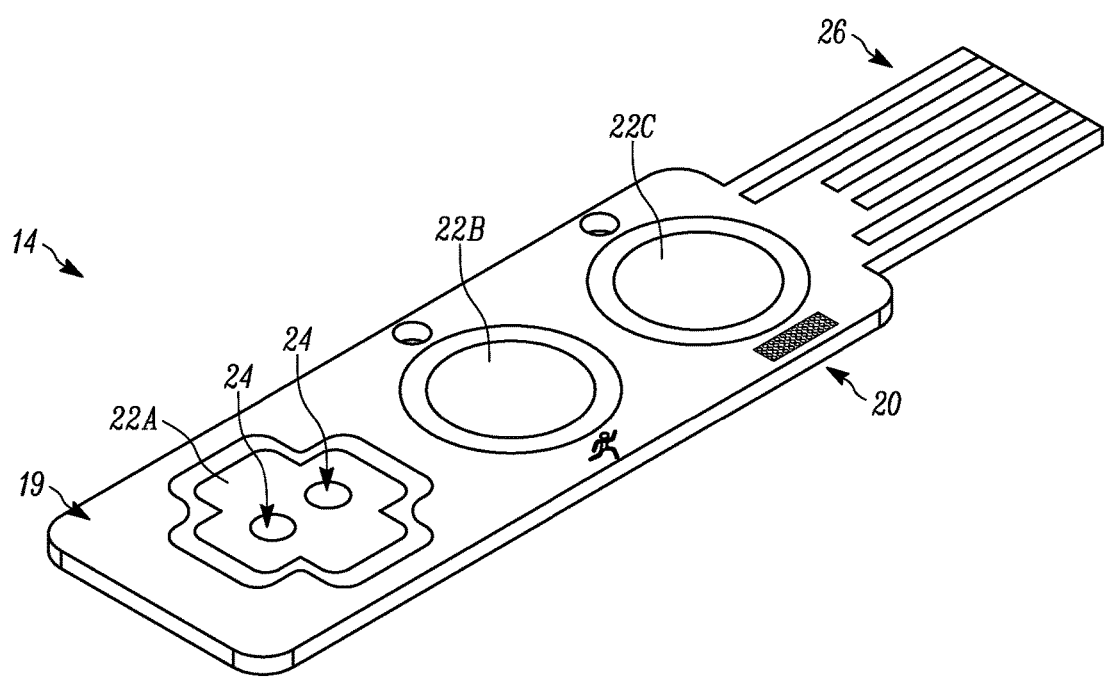
FIG. 2 illustrates the printed circuit board of FIG. 1.

FIG. 2 illustrates the printed circuit board 14 in more detail. The printed circuit board 14 includes a connector side 19 and a back side 20 opposite the connector side 19. The connector side 19 can include one or more contact pads 22A, 22B, and 22C. The contact pads 22A, 22B, and 22C can be etched in the printed circuit board 14 and can be coupled to electronic components (e.g., a microcontroller, an integrated circuit, and the like) mounted on the printed circuit board 14 via, for example, conductive traces on the printed circuit board 14. It should be understood that the contact pads can be positioned on other surfaces of the printed circuit board 14 (e.g., the back side 20).

For example, as shown in FIG. 2, the printed circuit board 14 includes three contact pads (e.g., contact pads 22A, 22B, and 22C) on the connector side 19. The contact pad 22A is in the shape of a cross while contact pads 22B and 22C are in the shape of a circle. It is to be understood that although three contact pads are described herein, more or less contact pads can be implemented. Furthermore, it is to be understood that although the contact pads 22A, 22B, and 22C are described herein as a cross and a circle, the contact pads can include other shapes (e.g., a circle, a triangle, a rectangle, a square, an oval, a heart, and the like) and may vary in combination of shapes. For example, the connector side 19 may include two contact pads where one contact pad is a triangle and the second contact pad is a square or both contact pads can be squares.

In some embodiments, the contact pads 22A, 22B, and 22C can include one or more openings or apertures that can penetrate the printed circuit board 14 to some degree (e.g., full penetration or partial penetration). For example, as illustrated in FIG. 2, the contact pad 22A includes two circular apertures 24 that fully penetrate the printed circuit board 14. Although FIG. 2 illustrates only one contact pad (e.g., contact pad 22A) having apertures, some embodiments include additional contact pads having apertures. Furthermore, in some embodiments, a contact pad can include more or less apertures. Additionally, although the apertures 24 are illustrated as being circular, it is to be understood that the apertures can take the form of other shapes (e.g., a circle, triangle, rectangle, heart, cross, and the like). The apertures 24 can fully or partially penetrate the printed circuit board 14. In some embodiments, one aperture can penetrate the printed circuit board 14 more or less than another aperture. In other words, the apertures may penetrate the printed circuit board 14 at various combinations of penetration degrees. In accordance with some embodiments, the surface of the apertures 24 can be coated with a conductive material causing the apertures 24 to be electrically coupled to the contact pad 24 and/or a magnet.

The printed circuit board 14 can also include a communication terminal 26. The communication terminal 26 may be integrated into the printed circuit board 14, and take the form of a universal serial bus (USB®) plug. In some embodiments, the communication terminal 26 is a communication port (e.g., a USB® port) that receives a communication plug (e.g., a USB® plug, and the like). The communication terminal 26 can enable the printed circuit board 14 to communicate, as described above, with the external computing device 12. For example, a computing terminal (e.g., a USB® port) of the external computing device 12 can receive the communication terminal 26 of the printed circuit board 14.

Figure 3A:
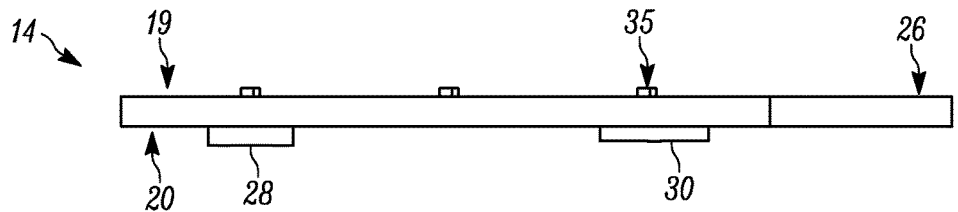
FIG. 3A illustrates a side view of the printed circuit board of FIG. 2.
Figure 3B:
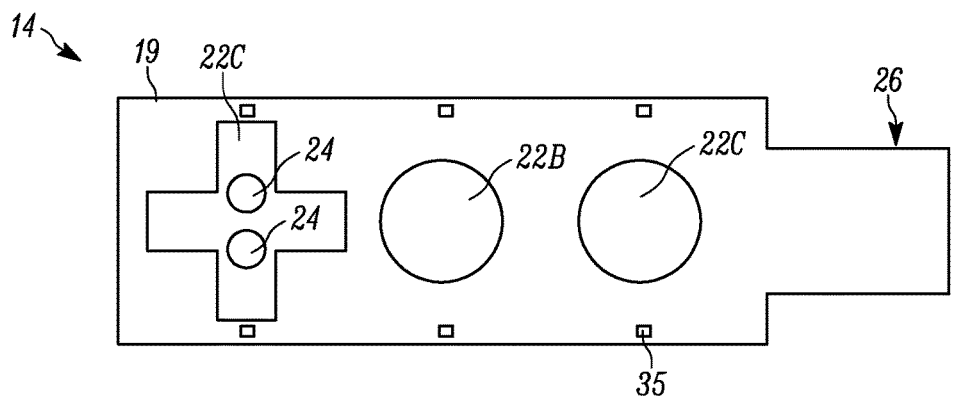
FIG. 3B illustrates a top view of the printed circuit board of FIG. 2.
Figure 3C:
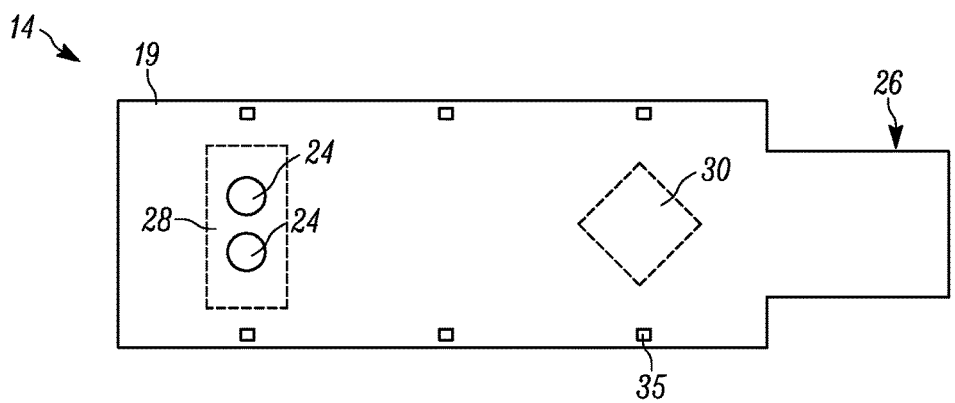
FIG. 3C illustrates a transparent top view of the printed circuit board of FIG. 2.

FIGS. 3A and 3B illustrate a side view and a top view, respectively, of the printed circuit board 14. As illustrated in FIG. 3A, a magnet 28 (e.g., a permanent magnet or an object that produces a magnetic field) can be positioned on the back side 20 of the printed circuit board 14. In accordance with some embodiments, the magnet 28 is aligned with the apertures 24. For example, as illustrated in FIG. 3C, the magnet 28 is transparently represented by a dashed line and is aligned with the apertures 24. As also illustrated in FIG. 3C, the surface area of the magnet 28 abutting the back side 20 is greater than the area of the opening of the each apertures 24 individually and in combination.

Although a single magnet is shown, multiple magnets can be used. For example, each contact pad can have a corresponding magnet positioned opposite each contact pad. In some embodiments, the magnet 28 can provide a magnetic attraction force for multiple contact pads. In other embodiments, multiple magnets can be used for a single contact pad. Furthermore, it should be understood that the magnet 28 may be any size or shape. For example, the magnet 28 can be larger than the apertures 28 in the printed circuit board 14 (as seen in FIG. 3C), can match the area of the contact pads 22A, 22B, and 22C, or can be smaller than the area of the contact pads 22A, 22B, 22C. In some embodiments, the magnet 28 has partial or full apertures that align with the apertures 24.

The magnetic field provided by the magnet 28 provides magnetic attraction forces. The magnetic attraction forces attract (e.g., pull) on other ferromagnetic materials, such as iron, steel, nickel, and cobalt. Ferromagnetic materials have a strong attractive force to a magnetic field while other materials have a weaker attractive force to a magnetic field. For example, the magnetic attraction force can attract a metallic end (e.g., a ferromagnetic end) of an electric cable (e.g., an alligator clip). The magnetic attraction force can hold the metallic end in place to provide and ensure an electrical connection between the corresponding contact pad and the connector (e.g., an alligator clip). In some embodiments, the magnet 28 alone can provide a sufficient attraction forces to maintain a connection of a metallic cable and a contact pad on the printed circuit board 14, or the magnet 28 in conjunction with another semi-permanent connector (e.g., close-biased "alligator clips") may be used to electrically couple a cable to a contact pad.

The magnet 28 can be bonded (e.g., via an adhesive) to the back side 20 of the printed circuit board 14 or the magnet 28 can be integrated into the printed circuit board 14 (e.g., as a layer in the printed circuit board 14). In some embodiments, the magnet 28 can be bonded (e.g., via an adhesive) to a housing 32 (seen in FIG. 4) that encloses the printed circuit board 14 and the electrical components of the printed circuit board 14.

As seen in FIGS. 3A and 3C, in some embodiments, the printed circuit board 14 also includes an integrated circuit 30 (IC) (e.g., a microprocessor, application specific integrated circuit, and the like). The integrated circuit 30 can be positioned on the same surface (e.g., the back side 20) of the printed circuit board 14 as the magnet 28. The integrated circuit 30 can be electrically coupled to the contact pad (e.g., contact pad 22A) of the printed circuit board 14 associated with the apertures 24. For example, an input pin or an output pin of the integrated circuit 30 may be electrically connected through conductive traces on the printed circuit board 14 to the contact pad 22A. In some embodiments, the contact pad 22A may be connected to another circuit on the printed circuit board 14 that is monitored by a sensor that has an output coupled to an input pin of the integrated circuit 30. Accordingly, an integrated circuit 30 can receive a user input via the contact pad 22A and/or the integrated circuit 30 can provide an output to the contact pad 22A.

Figure 4:
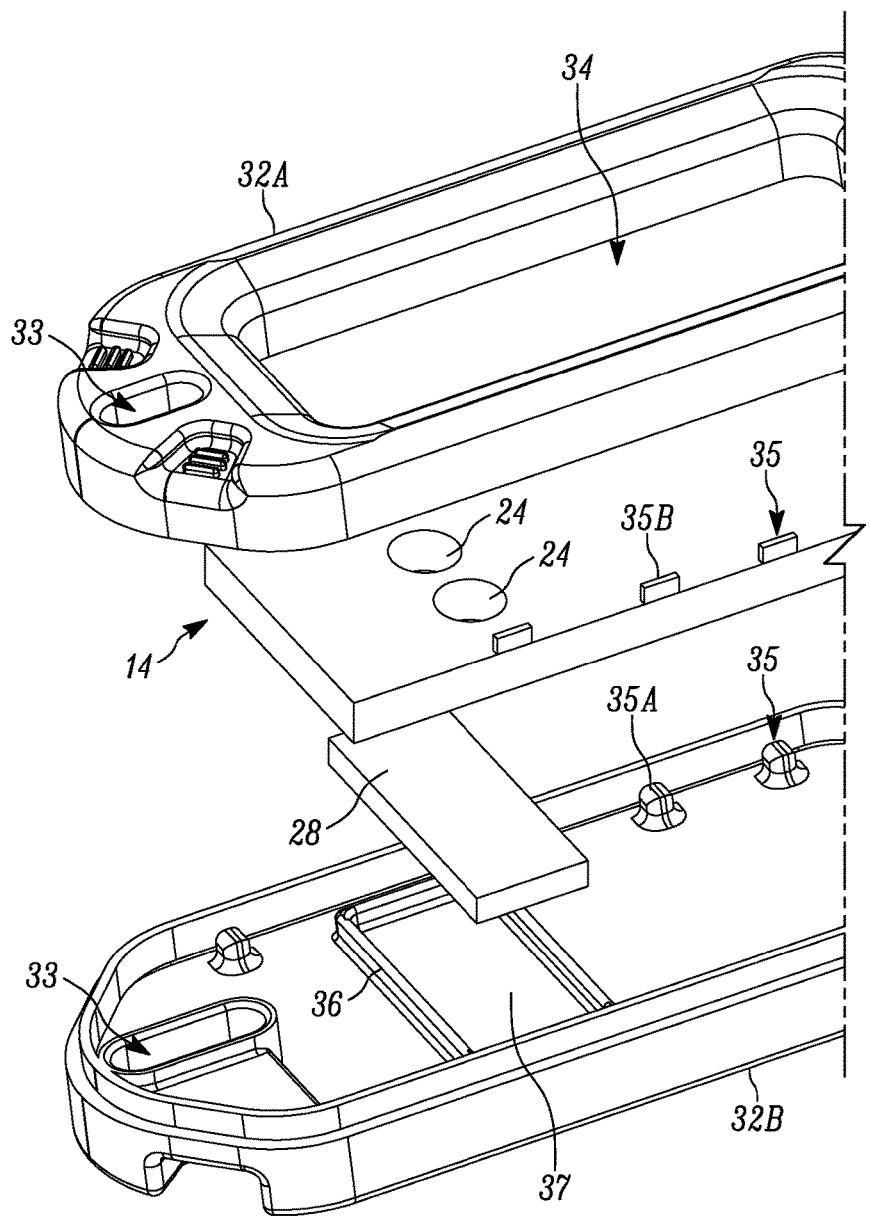
FIG. 4 illustrates an exploded view of the printed circuit board of FIG. 2.

FIG. 4 is an exploded view of the housing 32, the printed circuit board 14, and the magnet 28. The housing 32 provides an aesthetic design and allows a user to handle the printed circuit board 14 without damaging the printed circuit board 14, the electronic components on the printed circuit board 14, or the electrical connection on the printed circuit board 14. For example, the housing 32 allows the user to easily plug (e.g., connect) the communication terminal 26 of the printed circuit board 14 into a USB® port of the external computing device 12 and unplug (e.g., disconnect) the communication terminal 26 of the printed circuit board 14 from the USB® port of the external computing device 12. The housing 32 can also have an opening 33 for inserting a lanyard, such as a key chain.

As seen in FIG. 4, according to some embodiments, the housing 32 includes a first enclosure 32A and a second enclosure 32B. The first enclosure 32A and the second enclosure 32B can be attachable. When the first enclosure 32A and the second enclosure 32B are attached, the printed circuit board 14 can be positioned between the first enclosure 32A and the second enclosure 32B.

In some embodiments, the first enclosure 32A and the second enclosure 32B (e.g., the housing 32) include a plurality of alignment features 35 (e.g., posts). The plurality of alignment features 35 fix, secure, and align the printed circuit board 14 in a specific position within the housing 32 when the first enclosure 32A and the second enclosure 32B are attached. The first enclosure 32A includes a first plurality of alignment features (not shown) and the second enclosure 32B includes a second corresponding plurality of alignment features 35 (such as alignment feature 35a). The plurality of alignment features 35 can be formed in the first enclosure 32A and the second enclosure 32B or can be bonded (e.g., via an adhesive) to the first enclosure 32A and the second enclosure 32B. It is to be understood that the plurality of alignment features 35 may be various configurations. In some embodiments, the printed circuit board 14 includes a plurality of alignment features 35 (such as alignment feature 35b) integrated into or coupled to the printed circuit board 14 that mate with a plurality of corresponding alignment features 35 in the first enclosure 32A and the second enclosure 32B. For example, as seen in FIG. 4, the plurality of alignment features 35b are shown on the connector side 19 of the printed circuit board 14, but in other examples the plurality of alignment features 35 can be on the back side 20 of the printed circuit board 14.

As illustrated in FIG. 4, the magnet 28 can be held in a specific position by a magnet restraint 36. In some embodiments, the magnet restraint 36 can be formed within the housing 32 and can align the magnet 28 with the apertures 24 in the printed circuit board 14. The magnet restraint 36 can be a raised ridge around the perimeter of the magnet 28 forming a magnet receptacle 37. The raised edge of the magnet restraint 36 can fully or partially enclose the magnet 28. In some embodiments, the magnet restraint 36 is designed to allow for easy removal of the magnet to loosely fit within the magnet restraint 36 to allow for the magnet 28 when the printed circuit board 14 is removed from the housing 32. In some embodiments, the magnet restraint 26 can use other features to fix the position of the magnet 28 relative to the contact pads 22A, 22B, and 22C of the printed circuit board 14.

Figure 5:
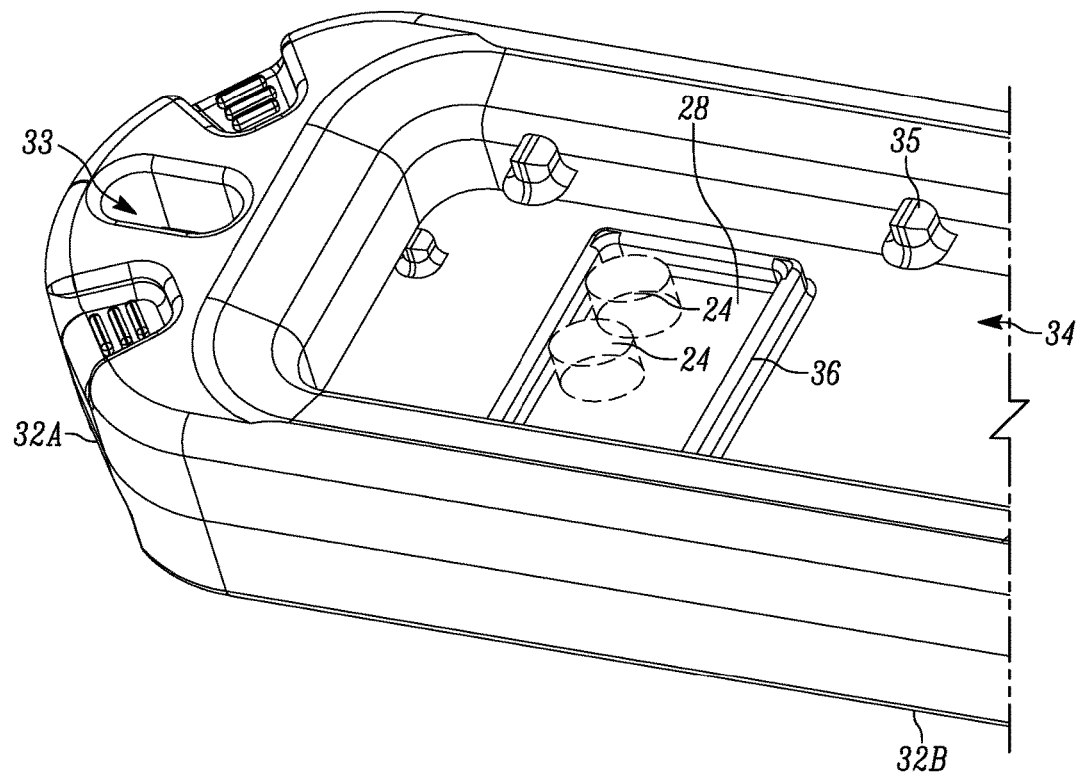
FIG. 5 illustrates a perspective view of the printed circuit board (transparent) of FIG. 2 in a housing with a magnet positioned below the transparent printed circuit board.

FIG. 5 illustrates a perspective view of the printed circuit board 14 (transparent) when the printed circuit board 14 is positioned within the housing 32 (e.g., between the first enclosure 32A and the second enclosure 32B). As seen in FIG. 5, the magnet 28 can be positioned within the magnet restraint 36 so that the magnet 28 is positioned opposite the entry ways of the apertures 24. The first enclosure 32A can include an opening 34 that exposes the contact pads 22A, 22B, and 22C on the connector side 19 of the printed circuit board 14 to the external environment. The opening 34 provides ease of access to the contact pads 22A, 22B, and 22B and the apertures 24 for magnetically coupling a connector to the printed circuit board 14.

Figure 6:
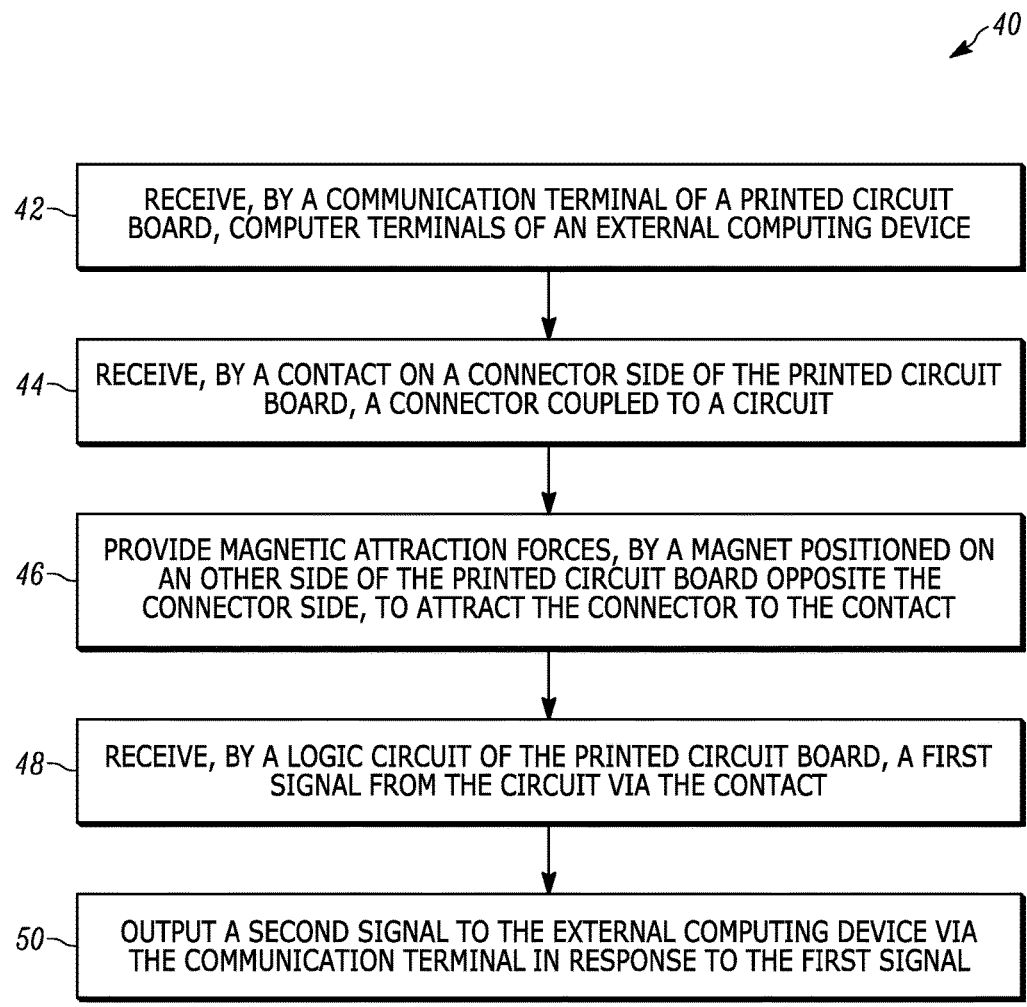
FIG. 6 illustrates a method of magnetic coupling using the system of FIG. 1.

FIG. 6 illustrates a method 40 of magnetic coupling using the system 10 shown in FIG. 1. The method 40 includes receiving, by the communication terminal 26 of the printed circuit board 14, computer terminals of the external computing device 12 (at block 42). As described above, the communication terminal 26 can be a communication plug or a communication port that can receive computer terminals through connection to a corresponding communication port or plug of the external computing device 12.

Figure 7A:
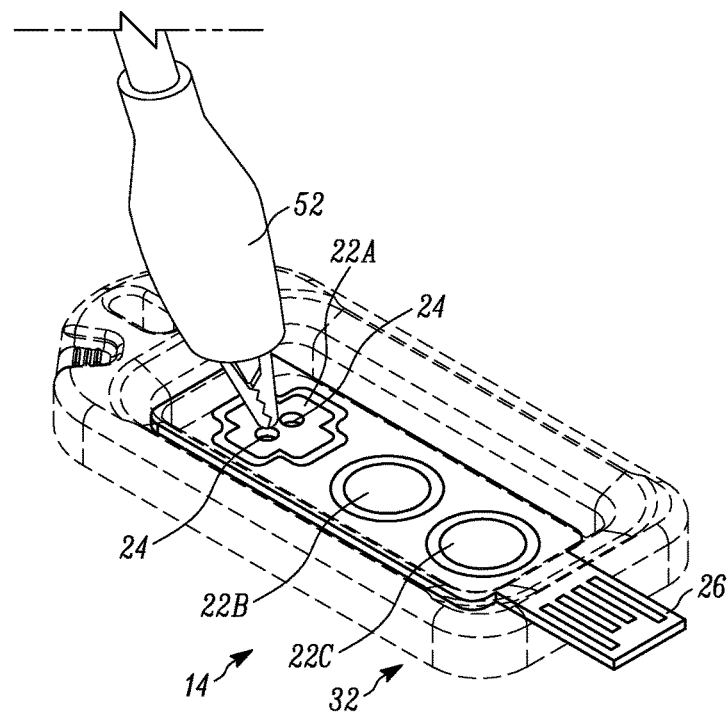
FIG. 7A illustrates a perspective view of coupling a connector to the printed circuit board of FIG. 2 by touching the connector to a contact pad on the printed circuit board.
Figure 7B:
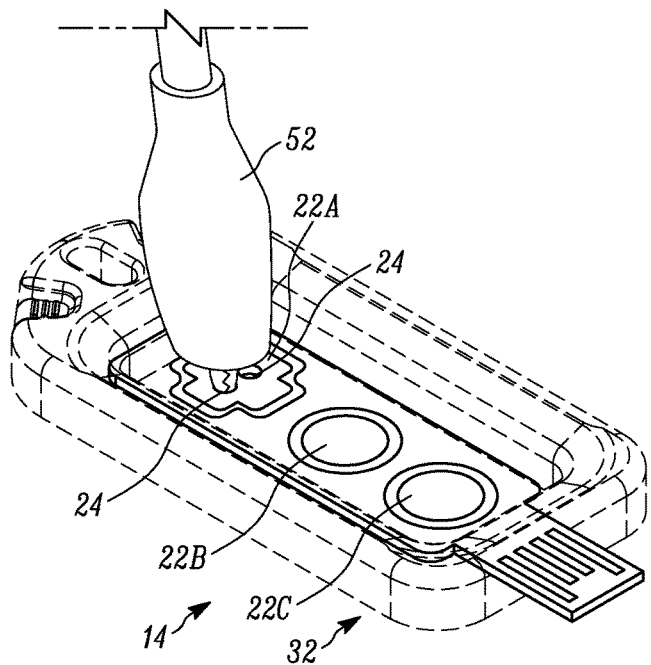
FIG. 7B illustrates a perspective view of coupling a connector to the printed circuit board of FIG. 2 by inserting the connector into an aperture of a contact pad on the printed circuit board.
Figure 7C:
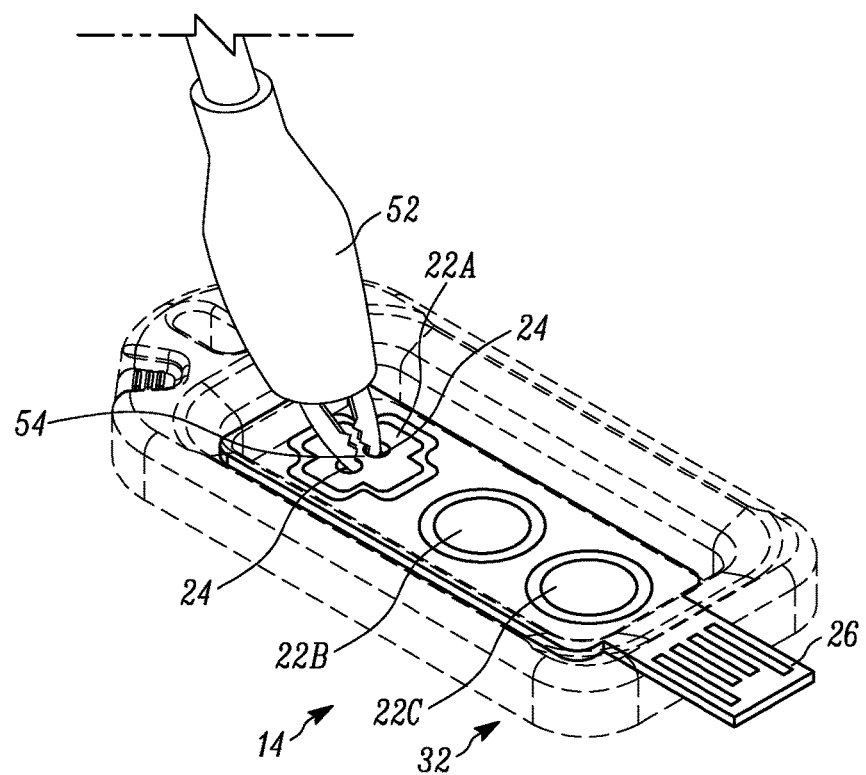
FIG. 7C illustrates a perspective view of coupling a connector to the printed circuit board of FIG. 2 by inserting two resilient ends of the connector into apertures of the contact pad as well as clamping the connector to a bridge portion of the printed circuit board separating the apertures.

The method 40 also includes receiving, by a contact pad (e.g., contact pads 22A, 22B, and 22C) on the connector side 19 of the printed circuit board 14, a connector coupled to the circuit 16 (at block 44). In some embodiments, the connector can be received by touching the connector to one of the plurality of contact pads 22A, 22B, and 22C. For example, as illustrated in FIG. 7A, a connector 52 (e.g., an alligator clip) is received by touching the connector 52 to the contact pad 22A. As illustrated, the connector 52 is positioned on an outer surface of the contact pad 22A outside of the apertures 24 rather than being recessed within either of the apertures 24. In some embodiments, the connector can be received by inserting the connector into an aperture in one of the plurality of contact pads 22A, 22B, and 22C. Depending on the size of the aperture and the connector, the aperture may also provide a friction fit between the aperture and the connector that enhances the coupling to the contact pad on the printed circuit board. For example, as illustrated in FIG. 7B, a connector 52 (e.g., an alligator clip) is received by inserting both the jaws of the connector 52 into one of the apertures 24 in the contact pad 22A. In some embodiments, the connector can be received by inserting two resilient ends of the connector (e.g., two spring-biased jaws of an alligator clip) into two apertures of the contact pad as well as clamping the connector to a bridge portion of the printed circuit board separating the two apertures. For example, as illustrated in FIG. 7C, the connector 52 (e.g., an alligator clip) is received by inserting each jaw of the alligator clip into a corresponding one of the apertures 24 of the contact pad 22A. The jaws assist in retaining the connector 52 by clamping a bridge portion 54 of the printed circuit board 14 between the two apertures 24 in the contact pad 22A.

Returning to FIG. 6, the magnetic attraction forces, as described above, are provided, by the magnet 28 positioned on the back side 20 of the printed circuit board 14 opposite the connector side 19, to attract the connector 52 to the contact pad (e.g., one of the plurality of contact pads 22A, 22B, and 22C) (at block 46).

For example, as seen in FIG. 7A, in response to the magnetic attraction forces provided by the magnet 28, when the connector 52 is touching the contact pad 22A on the connector side 19 of the printed circuit board 14, the connector 52 is magnetically coupled to the contact pad 22A. The magnetic coupling configuration illustrated in FIG. 7A, relative to those of FIGS. 7B and 7C, provides an electrical connection with the greatest distance between the metallic end of the connector 52 and the magnet 28 because the connector 52 is separated from the magnet 28 by the printed circuit board 14. Such a magnetic coupling configuration enables the user to quickly make an electrical connection between the connector 52 and at least one of the plurality of contact pads 22A, 22B, and 22C without precisely aiming or aligning the metallic end of the connector 52 to one or more of the apertures 24.

As seen in FIG. 7B, in response to the magnetic attraction forces provided by the magnet 28, when the connector 52 is inserted into the aperture 24 in the contact pad 22A on the connector side 19 of the printed circuit board 14, the connector 52 is magnetically coupled to the contact pad 22A. The magnetic coupling configuration illustrated in FIG. 7B provides a full electrical connection and a stronger magnetic coupling configuration than the magnetic coupling configuration shown in FIG. 7A. The magnetic field provided by the magnet 28 is stronger in the aperture 24 because the space between the magnet 28 and the connector 52 is reduced or eliminated relative to the magnetic coupling configuration illustrated in FIG. 7A. Like the magnetic coupling configuration illustrated in FIG. 7A, the magnetic coupling configuration illustrated in FIG. 7B provides a quick coupling technique for magnetically coupling the connector 52 to the contact pad 22A without needing to use the clamping feature of the connector 52.

As seen in FIG. 7C, in response to the magnetic attraction forces provided by the magnet 28, when the connector 52 is inserted into the apertures 24 and is attached to the bridge portion 54 of the printed circuit board 14 separating the two apertures 24, the connector 52 is magnetically coupled to the contact pad 22A as well as mechanically coupled to the contact pad 22A (e.g., clamping the alligator clip to the bridge portion of the printed circuit board 14). The magnetic coupling configurations illustrated in FIGS. 7A-7C provide various strengths of magnetic and mechanical coupling to the connector 52 (e.g., the alligator clip) using the same contact pad (e.g., contact pad 22A). The magnetic coupling configuration illustrated in FIG. 7C may maintain an electrical connection in situations where the connector 52 (e.g., the alligator clip) accidentally becomes mechanically disengaged from the apertures 24. In other words, if the connector 52 is mechanically disengaged from the two apertures 24 (e.g., through an accidental pull of the connector 52), the magnetic coupling configuration will switch to the magnetic coupling configuration of FIG. 7A or the magnetic coupling configuration of FIG. 7B as a result of the magnetic attraction forces acting on the metallic end of the connector 52, presuming the initial mechanical disengagement does not move the connector 52 outside of the range of magnetic attraction forces of the magnet 28. Thus, the electric connection is maintained. In the magnetic coupling configuration of FIG. 7C, the apertures 24 enable a quick connection of, for example, alligator clip cables (e.g., the connector 52) because each half of the alligator clip is received by a respective aperture and the spring-loaded alligator clip clamps onto the bridge portion of the printed circuit board 14 separating the two apertures 24. Although embodiments of the invention include the use of alligator clip cables, it is to be understood that other connecting techniques may be used. For example, the apertures 24 may receive pin connectors sized to fit within the apertures 24 and provide a level of friction-based retainment in addition to being subject to attraction forces of the magnet 28.

Returning to FIG. 6, at block 48, a logic circuit (e.g., integrated circuit 30) of the printed circuit board 14 receives a first signal from the circuit 16 via the contact pad 22A. The first signal can be received via the electrical connection between the connector 52, the contact pad 22A, and the printed circuit board 14, as described above. In some embodiments, the first signal results from completing a conductive circuit loop in the circuit 16. For example, if a person completes the conductive circuit loop within the circuit 16 (e.g., by touching an apple), the printed circuit board 14 detects the completion of the conductive circuit loop (e.g., detects the first signal). The printed circuit board 14 may include sensing circuitry (e.g., a voltage or current sensor) coupled to the integrated circuit 30 to detect the first signal.

In response to the first signal, a second signal is output by the logic circuit (e.g., the integrated circuit 30) to the external computing device 12 via the communication terminal 26 of the printed circuit board 14 (at block 50). For example, when the printed circuit board 14 detects the completion of the conductive circuit loop (e.g., the integrated circuit 30 detects the first signal), the printed circuit board 14 (e.g., the integrated circuit 30) generates and outputs an output signal (e.g., the second signal) to the external computing device 12 (e.g., via the communication terminal 26 of the printed circuit board 14). The second signal can, for example, be a signal associated with a keyboard action or a mouse action (e.g., key press, mouse click, or mouse movement). When the external computing device 12 receives the second signal, the external computing device 12 can, for example, react as if the second signal were sent from a standard keyboard or mouse. Therefore, a user, such as the person in the above example, can simulate a key stroke on a keyboard by touching the conductive element 18 of the circuit 16 and the external computing device 12 will receive the simulated key stroke and react as if the user had pressed the actual key on the key board that is being simulated. For instance, in a word processing program, and where the key stroke simulated is the letter "w," upon the user touching the conductive element 18, the word processing program would react as if the user pressed the "w" on the keyboard and display a new "w" on a display of the external computing device 12.

Although steps of the method 40 are shown and described as occurring serially, one or more step may occur in a different order, simultaneously, or both.

Various features and advantages of the invention are set forth in the following claims.

What is claimed is:

1. A system for magnetically coupling a plurality of electronic components, the system comprising:
    an external computing device;
    a connector having a conductive end;
    a printed circuit board, the printed circuit board including
        a connector side opposite a back side, the connector side having a contact pad with an aperture,
        a magnet positioned on the back side of the printed circuit board and providing a magnetic field configured to provide magnetic attraction forces to a connector contacting the contact pad, and
        a communication terminal; and
    a circuit in communication with the printed circuit board through the connector and contact pad.

2. The system of claim 1, wherein the magnet is aligned with the aperture.

3. The system of claim 1, wherein the magnet is retained within a magnet restraint of an external housing, the magnet restraint including raised edges to engage a perimeter of the magnet.

4. The system of claim 1, wherein the printed circuit board further comprises a logic circuit positioned on the back side of the printed circuit board, and wherein the logic circuit is electrically coupled to the contact pad.

5. The system of claim 1, further comprising a logic circuit coupled to the contact pad to receive an input signal and coupled to the communication terminal to provide an output signal based on the input signal.

6. The system of claim 1, wherein the aperture is configured to receive the connector.

7. The system of claim 1, wherein the contact pad includes at least two apertures separated by a bridge.

8. A peripheral device, the peripheral device comprising:
    a connector side opposite a back side, the connector side having a contact pad with an aperture;
    a magnet positioned on the back side of the peripheral device and providing a magnetic field configured to provide magnetic attraction forces to a connector contacting the contact pad;
    and
    a communication terminal.

9. The peripheral device of claim 8, wherein the peripheral device is powered via a portable power supply coupled through the communication terminal.

10. The peripheral device of claim 8, wherein the aperture surface is coated with a conductive material and electrically coupled to the contact pad.

11. The peripheral device of claim 8, further comprising a housing configured to receive the peripheral device, wherein the housing includes a plurality of alignment features that align the peripheral device within the housing.

12. The peripheral device of claim 11, wherein the housing further includes a magnet restraint for receiving the magnet, and wherein the magnet restraint is aligned opposite an entryway of the aperture.

13. The peripheral device of claim 11, wherein the housing includes an opening that exposes the contact pad to an external environment.

14. The peripheral device of claim 8, further comprising a logic circuit positioned on the back side of the peripheral device, wherein the logic circuit is electrically coupled to the contact pad.

15. The peripheral device of claim 8, wherein the aperture is configured to receive the connector.

16. The peripheral device of claim 8, wherein the contact pad includes at least two apertures separated by a bridge.

17. A method of magnetic coupling, the method comprising:
    receiving, by a communication terminal of a printed circuit board, computer terminals of an external computing device;
    receiving, by a contact pad on a connector side of the printed circuit board, a connector coupled to a circuit;
    providing magnetic attraction forces, by a magnet positioned on a back side of the printed circuit board opposite the connector side, to attract the connector to the contact pad;
    receiving, by a logic circuit of the printed circuit board, a first signal from the circuit via the contact pad; and outputting a second signal to the external computing device via the communication terminal in response to the first signal.

18. The method of claim 17, wherein receiving, by a contact pad on a connector side of the printed circuit board, a connector coupled to a circuit includes positioning the connector on the contact pad on the connector side of the printed circuit board.

19. The method of claim 18, wherein receiving, by a contact pad on a connector side of the printed circuit board, a connector coupled to a circuit includes positioning the connector within an aperture of the contact pad on the connector side of the printed circuit board.

20. The method of claim 17, wherein receiving, by a contact pad on a connector side of the printed circuit board, a connector coupled to a circuit includes coupling the connector across a bridge between two apertures of the contact pad on the connector side of the printed circuit board.

* * * * *